(12) United States Patent
Ruoff et al.

(10) Patent No.: US 11,078,594 B2
(45) Date of Patent: Aug. 3, 2021

(54) SINGLE CRYSTALLINE METAL FOIL AND MANUFACTURING METHOD THEREFOR

(71) Applicants: INSTITUTE FOR BASIC SCIENCE, Daejeon (KR); UNIST(ULSAN NATIONAL INSTITUTE OF SCIENCE AND TECHNOLOGY), Ulsan (KR)

(72) Inventors: Rodney S. Ruoff, Ulsan (KR); Sunghwan Jin, Ulsan (KR)

(73) Assignees: INSTITUTE FOR BASIC SCIENCE, Daejon (KR); UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 75 days.

(21) Appl. No.: 16/317,332

(22) PCT Filed: Jul. 12, 2017

(86) PCT No.: PCT/KR2017/007438
§ 371 (c)(1),
(2) Date: Jan. 11, 2019

(87) PCT Pub. No.: WO2018/012864
PCT Pub. Date: Jan. 18, 2018

(65) Prior Publication Data
US 2019/0242028 A1    Aug. 8, 2019

(30) Foreign Application Priority Data

Jul. 12, 2016  (KR) .................. 10-2016-0087904
Jul. 11, 2017  (KR) .................. 10-2017-0087731

(51) Int. Cl.
C30B 1/02       (2006.01)
C22F 1/08       (2006.01)
(Continued)

(52) U.S. Cl.
CPC .................. *C30B 1/02* (2013.01); *C22F 1/00* (2013.01); *C22F 1/08* (2013.01); *C22F 1/10* (2013.01);
(Continued)

(58) Field of Classification Search
None
See application file for complete search history.

(56) References Cited

U.S. PATENT DOCUMENTS 3,098,741 A * 7/1963 Enk .......................... C30B 11/10
                                                              117/18
3,694,269 A * 9/1972 Bailey et al. ............. C30B 1/02
                                                              117/7

(Continued)

FOREIGN PATENT DOCUMENTS

CN  103526138 A   1/2014
CN  103643288 A   3/2014
(Continued)

OTHER PUBLICATIONS

European Search Report dated Feb. 17, 2020, in connection with corresponding Korean Patent Application No. PCT/KR2017/007438.

(Continued)

Primary Examiner — George Wyszomierski
(74) Attorney, Agent, or Firm — Hauptman Ham, LLP

(57) ABSTRACT

The present invention relates to a manufacturing method for single crystalline metal foil including: thermally treating poly-crystalline metal foil positioned to be spaced apart from a base to manufacture single crystalline metal foil, and a single crystalline metal foil manufactured thereby. According to the present invention, single crystalline metal foil having a large area may be obtained by thermally treating (Continued)

the poly-crystalline metal foil under a condition at which stress applied to the poly-crystalline metal foil is minimized.

7 Claims, 10 Drawing Sheets

(51) Int. Cl.
    *C22F 1/00*     (2006.01)
    *C30B 25/14*     (2006.01)
    *C22F 1/10*     (2006.01)
    *C30B 25/18*     (2006.01)
    *C30B 29/02*     (2006.01)

(52) U.S. Cl.
    CPC .............. *C30B 25/14* (2013.01); *C30B 25/18* (2013.01); *C30B 29/02* (2013.01)

(56) References Cited

U.S. PATENT DOCUMENTS

| | | | |
|---|---|---|---|
| 5,114,528 A * | 5/1992 | Kou | C30B 13/18 117/202 |
| 7,922,812 B2 | 4/2011 | Ciulik et al. | |
| 2009/0120351 A1 | 5/2009 | Ciulik et al. | |
| 2016/0108546 A1 | 4/2016 | Park et al. | |

FOREIGN PATENT DOCUMENTS

| | | |
|---|---|---|
| CN | 104451890 A | 3/2015 |
| CN | 105112999 A | 12/2015 |
| CN | 105603514 A | 5/2016 |
| CN | 105603518 A | 5/2016 |
| FR | 2251368 A1 * | 6/1975 |
| JP | 10-298000 A | 11/1998 |
| KR | 10-2013-0020351 A | 2/2013 |
| KR | 10-1425498 B1 | 8/2014 |
| KR | 10-2014-0137301 A | 12/2014 |
| KR | 10-2015-0141139 A | 12/2015 |
| WO | 2006124266 A2 | 11/2006 |

OTHER PUBLICATIONS

Australian Examination Report dated Aug. 2, 2019, in connection with the Australian Patent Application No. 2017297850.
Seong-Yong Cho, Gas transport controlled synthesis of graphene by employing a micro-meter scale gap jig, RSC Advances, Oct. 24, 2013 pp. 26376-26381, vol. 3, The Royal Society of Chemistry.
Korean Office Action dated Jan. 29, 2019 in connection with the counterpart Korean Patent Application No. 10-2018-0014745.
Kumar et al., "Rapid synthesis of few-layer graphene over Cu foil," CARBON vol. 50, Nov. 25, 2011, pp. 1546-1553.
International Search Report dated Nov. 14, 2017, issued in corresponding International Application No. PCT/KR2017/007438.
Sunghwan Jin et al., "Preparation and uses of large area single crystal metal foils," APL Materials, 7, 100905, Oct. 25, 2019.
Chinese Office Action for corresponding Chinese application No. 201780043041.0 dated Jun. 18, 2020.

* cited by examiner (111)

*SCALE BAR = 35 μm

*SCALE BAR = 35 μm

SINGLE CRYSTALLINE METAL FOIL AND MANUFACTURING METHOD THEREFOR

CROSS REFERENCE TO RELATED APPLICATION

This present application is a national stage filing under 35 U.S.C § 371 of PCT application number PCT/KR2017/007438 filed on Jul. 12, 2017 which is based upon and claims the benefit of priority to Korean Patent Application Nos. 10-2016-0087904 and 10-2017-0087731 filed on Jul. 12, 2016 and Jul. 11, 2017, respectively, in the Korean Intellectual Property Office. The disclosures of the above-listed applications are hereby incorporated by reference herein in their entirety.

TECHNICAL FIELD

The present invention relates to single crystalline metal foil and a manufacturing method therefor, and more particularly, to a manufacturing method for single crystalline metal foil having a large area by thermally treating poly-crystalline metal foil under a condition at which stress applied to the poly-crystalline metal foil is minimized, and single crystalline metal foil manufactured thereby.

BACKGROUND ART

A single crystalline metal means a material in which an entire sample thereof is formed of a single crystal without a grain boundary, and is known to exhibit specific properties as compared to a poly-crystalline metal. It was reported that since there is no electron scattering at a grain boundary of single crystalline copper, the single crystalline copper has higher electric conductivity than that of poly-crystalline copper, and also silver. It was reported that since there is no grain boundary slip in a single crystalline superalloy, the single crystalline superalloy has excellent creep resistance. Furthermore, due to a uniform surface crystal orientation, the single crystalline metal may be used as a catalyst in various chemical reactions such as a CO oxidation reaction and an $O_2$ reduction reaction. Recently, a number of researchers have an interest particularly in utilization of a single crystalline metal particularly as a catalyst for growth of a two-dimensional nanomaterial including graphene.

Meanwhile, graphene, which is a two-dimensional nanomaterial having properties such as excellent charge mobility, optical transparency, mechanical strength, flexibility, and environmental resistance, is a material capable of being applied to various fields such as a multifunctional nanocomposite material, a transparent electrode material, and a next-generation semiconductor device.

As a preparation method for graphene having a large area, a chemical vapor deposition (CVD) method has been widely used. The preparation method for graphene using the CVD method is a method for synthesizing graphene from a carbon-containing precursor at a high temperature using a transition metal catalyst layer.

During the graphene growth by the CVD method, it is known that graphene grows epitaxially on the transition metal layer. A commercially available poly-crystalline transition metal layer is mainly used, but mostly, poly-crystalline graphene is obtained. In the poly-crystalline graphene, scattering of carriers and phonons, and stress concentration occur at a grain boundary as compared to single crystalline graphene, such that the poly-crystalline graphene exhibits relatively inferior physical properties.

Therefore, in order to synthesize single crystalline graphene having a large area, the development of a method capable of forming a single crystalline metal layer having a large area is a prerequisite.

In order to manufacture a single crystalline metal, a technology of epitaxially growing a metal on a single crystalline sapphire substrate through a thermal evaporation method, an electron beam evaporation method, a sputtering method, or the like, and synthesizing graphene based thereon has been reported. However, since an expensive single crystalline substrate should be used in these methods, there are disadvantages in that an area is restrictive, and economical efficiency is low (Korean Patent Laid-Open Publication No. 10-2013-0020351).

Instead of a method for forming a metal layer on an expensive single crystalline substrate, a method for controlling an injection amount and an injection rate of hydrogen or hydrogen-argon mixed gas, a temperature, a pressure, and a thermal treatment time, and the like, to convert a commercially available poly-crystalline metal thin film into a single crystalline metal thin film has been reported (Korean Patent Laid-Open Publication No. 10-2014-0137301).

However, in the method disclosed in Korean Patent Laid-Open Publication No. 10-2014-0137301, there are problems in that when a thickness of a poly-crystalline copper thin film is more than 18 µm, since a grain and a grain boundary remain in the copper thin film as they are in spite of thermal treatment under optimal conditions, it is impossible to manufacture a proper single crystalline copper thin film, such that a thickness of a usable poly-crystalline copper thin film is limited in a significantly narrow range of 5 to 18 µm.

Further, in the case of performing thermal treatment without a substrate, there is a problem in that as the thermal treatment is performed in a state in which the poly-crystalline copper thin film is put into a chamber as it is to come in direct contact with a bottom surface of the chamber, a grain growth pinning may occur from a contact region of the copper thin film, or stress may occur due to thermal deformation of a metal thin film caused by high-temperature thermal treatment, such that conversion to a single crystalline film does not effectively occur, and thus a poly-crystalline copper thin film is formed.

Therefore, the present inventors continuously conducted studies in order to manufacture single crystalline metal foil having a large area by minimizing a contact between a chamber and poly-crystalline metal foil to prevent the grain growth pinning phenomenon and suppressing stress from being generated by thermal deformation, thereby completing the present invention.

DISCLOSURE

Technical Problem

An object of the present invention is to provide a manufacturing method for single crystalline metal foil having a large area by thermally treating poly-crystalline metal foil under conditions at which stress applied thereto is minimized, and single crystalline metal foil manufactured thereby.

Technical Solution

In one general aspect, a manufacturing method for single crystalline metal foil includes: thermally treating poly-crystalline metal foil positioned to be spaced apart from a base to manufacture single crystalline metal foil.

The poly-crystalline metal foil may be positioned to be spaced apart from the base by fixing a fixation part of the poly-crystalline metal foil with a fixation member, a non-fixation part of the poly-crystalline metal foil except for the fixation part may be freely suspended, and the number of fixation parts of the poly-crystalline metal foil may be one or two or more.

The non-fixation part may be thermally treated in a state in which the non-fixation part is kept straight.

The poly-crystalline metal foil may have a thickness of 5 to 200 µm and be copper (Cu), nickel (Ni), cobalt (Co), iron (Fe), ruthenium (Ru), rhodium (Rh), palladium (Pd), platinum (Pt), silver (Ag), rhenium (Re), iridium (Ir), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn) foil.

The single crystalline metal foil may have the same crystal plane as each other on both surfaces thereof, and have a (111), (001), (112), (123), or (0001) crystal plane based on a direction perpendicular to the plane.

The thermal treatment may be performed at a temperature satisfying the following Equation 2 and a pressure of 0.0001 to 10 atm for 0.5 to 90 hours.

$$0.3 \times T_m \leq T < T_m \quad \text{[Equation 2]}$$

(In Equation 2, T is a thermal treatment temperature (° C.), and $T_m$ is a melting point temperature (° C.) of a metal of the poly-crystalline metal foil.)

The thermal treatment may be performed under a hydrogen gas atmosphere, an argon gas atmosphere, or a hydrogen-argon mixed gas atmosphere, wherein the hydrogen gas, the argon gas, or the hydrogen-argon mixed gas is injected at a rate of 1 to 500 sccm.

In another general aspect, there is provided a single crystalline metal foil manufactured by the manufacturing method for single crystalline metal foil described above.

In another general aspect, there is provided a single crystalline metal foil having the same crystal plane on both surfaces thereof.

The single crystalline metal foil may satisfy the following Equation 1.

$$95 \leq (A_{normal}/A_{total}) \times 100 \quad \text{[Equation 1]}$$

(In Equation 1, $A_{total}$ is a total area of a test sample, and $A_{normal}$ is an area of grains having the same crystal plane in a plane normal direction in the test sample. $A_{normal}/A_{total}$ is measured based on a test sample having a size of 2 cm×8 cm, and the same crystal plane is a (111), (001), (112), (123), or (0001) crystal plane.)

In another general aspect, a manufacturing apparatus for single crystalline metal foil includes: a chamber; a heater provided in one side of the chamber to apply heat; a gas inlet through which a gas is injected to the chamber; a gas outlet through which the gas is discharged from the chamber; a pressure controller connected to the chamber; and a metal foil holder provided in the chamber. Here, a shape of each of the devices is not particularly limited but each of the devices may have various shapes and sizes.

A shape of the metal foil holder is not particularly limited as long as it may minimize deformation of the poly-crystalline metal foil generated by a contact with the chamber, the holder, and the like, during thermal treatment and maintain a state in which the poly-crystalline metal foil is kept straight, but as a preferable example, the metal foil holder may include a metal foil fixation member provided with a rod, a clamp, or a hook ring.

The heater may apply heat using a furnace, a resistive heating method, a ramp heating method, or an induction heating method, and a heating method of the heater is not particularly limited as long as it is possible to increase a temperature to a desired temperature.

Advantageous Effects

In a manufacturing method for single crystalline metal foil, a contact between a poly-crystalline metal foil and other materials may be minimized by positioning the poly-crystalline metal foil to be spaced apart from a base, such that a grain growth pinning phenomenon may be prevented, and stress generation caused by thermal deformation may be suppressed, thereby making it possible to effectively manufacture single crystalline metal foil having a large area.

Further, as both surfaces of the poly-crystalline metal foil may be thermally treated under the same conditions as each other by positioning the poly-crystalline metal foil to be spaced apart from the base, conversion to single crystalline metal foil may be more effectively performed. Therefore, both surfaces of the manufactured single crystalline metal foil may have the same crystal plane as each other.

BRIEF DESCRIPTION OF DRAWINGS

FIGS. 5B and 5C show analysis results of changes in EBSD IPF map and orientation distribution function (ODF) of the copper foil depending on the thermal treatment conditions, wherein FIG. 5B shows copper foil oriented to a (111) crystal plane in the plane normal direction, and FIG. 5C shows copper foil oriented to a (001) crystal plane in the plane normal direction.

DETAILED DESCRIPTION OF MAIN ELEMENTS

Figure 1:
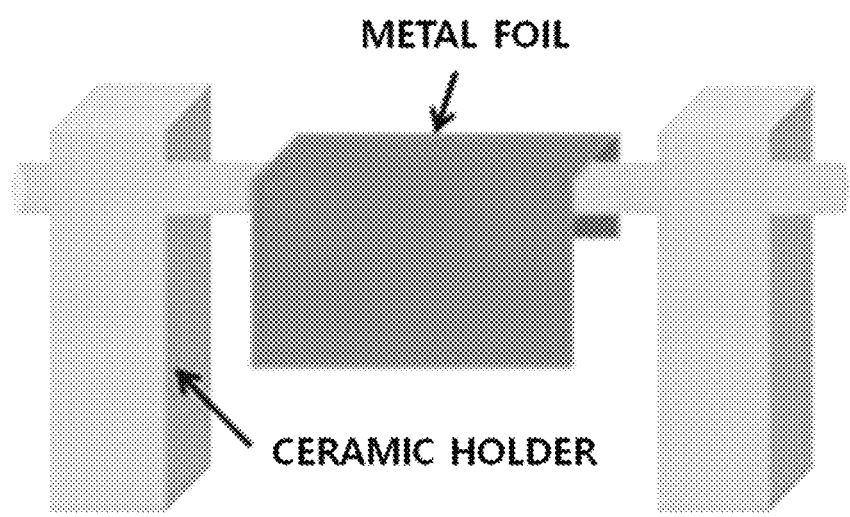
FIG. 1 is a schematic diagram showing poly-crystalline metal foil hanging on a holder according to an exemplary embodiment of the present invention. In order to hang the poly-crystalline metal foil on the holder, one end of the metal foil was folded two times at an interval of 5 mm and an angle of 90° to thereby have a hook shape, such that the metal foil could hang on the holder.
Figure 2A:
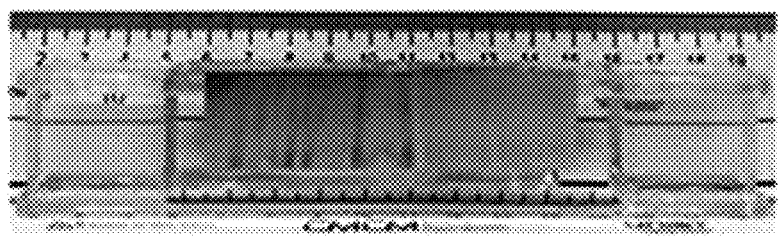
FIG. 2A is a photograph of poly-crystalline copper foil before thermal treatment.
Figure 2B:
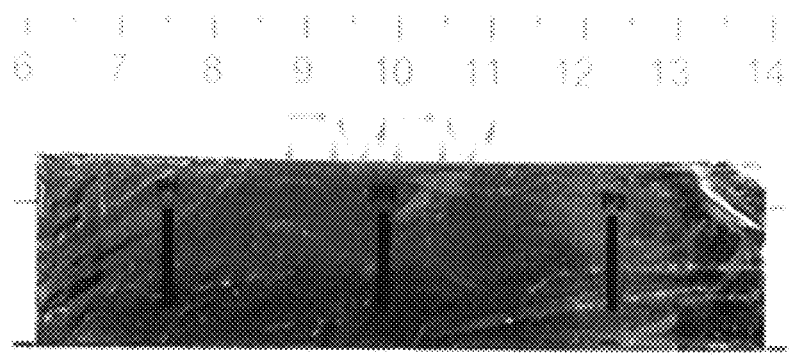
FIG. 2B is a photograph of single crystalline copper foil manufactured according to an exemplary embodiment of the present invention.
Figure 2C:
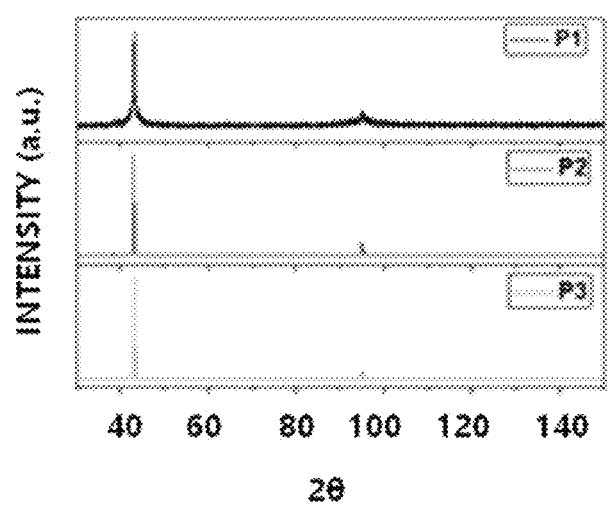
FIG. 2C shows X-ray diffraction (XRD) analysis results of positions P1 to P3 of FIG. 2B.
Figure 2D:
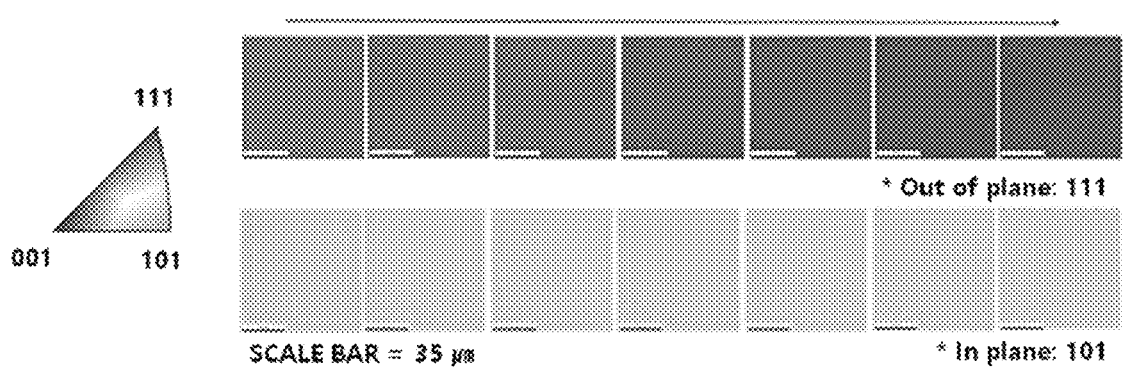
FIG. 2D shows analysis results of plane-normal and in-plane electron backscatter diffraction (EBSD) inverse pole figure (IPF) maps of the single crystalline copper foil manufactured in FIG. 2B.
Figure 3A:
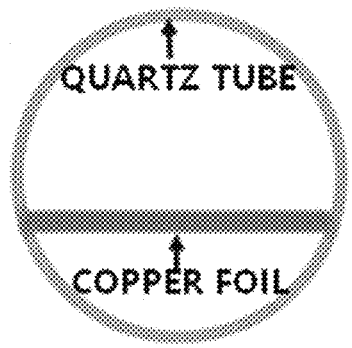
FIG. 3A is a schematic diagram showing a manufacturing method for single crystalline metal foil by thermally treating poly-crystalline metal foil in a state in which the poly-crystalline copper foil is put on a quartz tube according to an existing method.
Figure 3B:
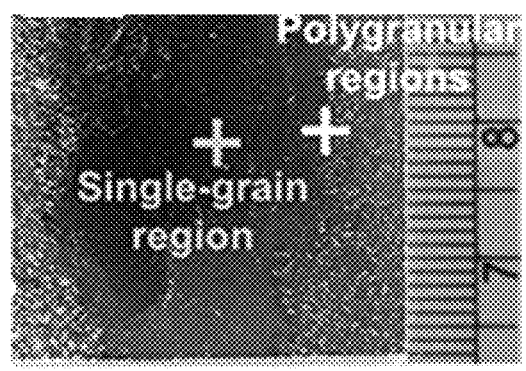
FIG. 3B is a photograph of single crystalline copper foil manufactured thereby.
Figure 3C:
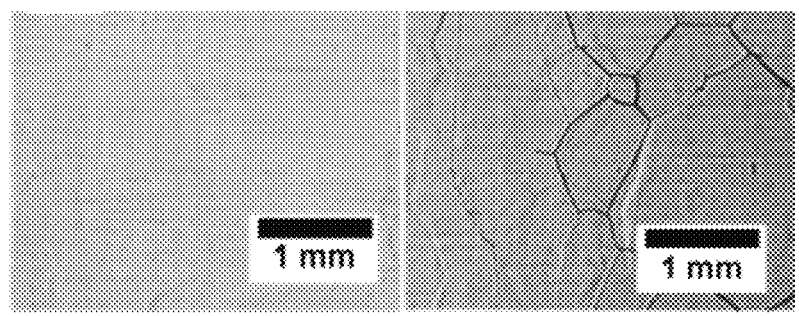
FIG. 3C shows optical microscopy images of a single crystalline region (left) and a poly-crystalline region (right)
Figure 3D:
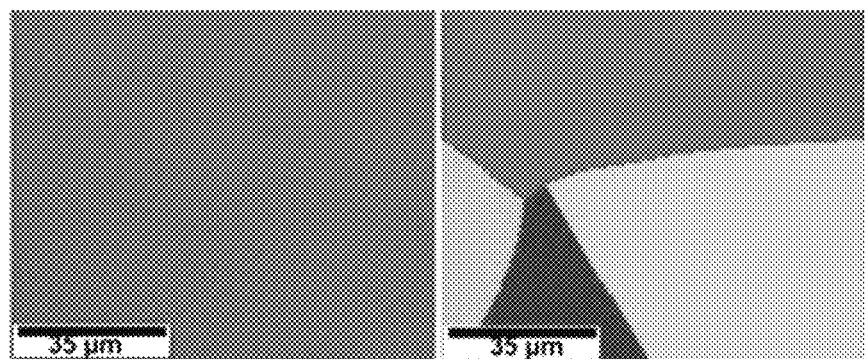
FIG. 3D shows analysis results of EBSD IPF maps of the single crystalline region (left) and the poly-crystalline region (right).

100: chamber 200: heater
300: gas inlet 400: gas outlet
500: pressure controller

BEST MODE

Hereinafter, single crystalline metal foil and a manufacturing method therefor according to the present invention will be described in detail with reference to the accompanying drawings.

The following accompanying drawings are provided by way of example so that the idea of the present invention can be sufficiently transferred to those skilled in the art to which the present invention pertains. Therefore, the present invention is not limited to the drawings to be provided below, but may be modified in different forms. In addition, the drawings to be provided below may be exaggerated in order to clarify the scope of the present invention. Here, technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

The present invention relates to a manufacturing method for single crystalline metal foil having a large area by thermally treating poly-crystalline metal foil under conditions at which stress applied thereto is minimized, and single crystalline metal foil manufactured thereby.

An existing manufacturing method for single crystalline metal foil had problems in that when a thickness of poly-crystalline copper foil is more than 18 μm, since a grain and a grain boundary remain in the copper foil as they are in spite of thermal treatment under optimal conditions, it is impossible to manufacture proper single crystalline copper foil, such that a thickness of a usable poly-crystalline copper foil is limited in a significantly narrow range of 5 to 18 μm.

Further, in the case of performing thermal treatment without a substrate, there is a problem in that as the thermal treatment is performed in a state in which the poly-crystalline copper foil is put into a chamber as it is to come in direct contact with a bottom surface of the chamber, a grain growth pinning phenomenon may occur based on a contact region of the copper foil, or stress may occur due to thermal deformation of a metal foil caused by high-temperature thermal treatment, such that conversion to single crystalline foil does not effectively occur, and thus a poly-crystalline copper foil is formed.

Therefore, the present inventors continuously conducted studies in order to manufacture the single crystalline metal foil having a large area by minimizing a contact with a chamber and poly-crystalline metal foil to prevent the grain growth pinning phenomenon and suppressing stress from being generated by thermal deformation, thereby completing the present invention.

More specifically, the present invention relates to a manufacturing method for single crystalline metal foil including: thermally treating poly-crystalline metal foil positioned to be spaced apart from a base to manufacture single crystalline metal foil.

A contact between the poly-crystalline metal foil and other materials may be minimized by positioning the poly-crystalline metal foil to be spaced apart from the base, for example, a bottom surface or an inner surface of a chamber as described above, such that a grain growth pinning phenomenon may be prevented, and stress generation caused by thermal deformation may be suppressed, thereby making it possible to effectively manufacture single crystalline metal foil having a large area.

Further, as both surfaces of the poly-crystalline metal foil may be thermally treated under the same conditions as each other by positioning the poly-crystalline metal foil to be spaced apart from the base, conversion to single crystalline metal foil may be more effectively performed. Therefore, both surfaces of the manufactured single crystalline metal foil may have the same crystal plane as each other. Particularly, as the single crystalline metal foil may have the same crystal plane in both in-plane and out-of-plane directions, single crystalline metal foil having high quality may be manufactured. More specifically, the single crystalline metal foil may have a (111), (001), (112), (123), or (0001) crystal plane in the plane normal direction.

A poly-crystalline metal foil according to an exemplary embodiment of the present invention may be positioned to float on the base by fixing a region of the poly-crystalline metal foil using a specific fixation member. A spaced distance between the base and the polycrystalline metal foil is not particularly limited as long as the poly-crystalline metal foil does not come in contact with the base.

More specifically, the poly-crystalline metal foil is positioned to be spaced apart from the base by fixing a fixation part of the poly-crystalline metal foil with the fixation member, and a non-fixation part of the poly-crystalline metal foil except for the fixation part may be freely suspended.

That is, it is possible to prevent the other regions of poly-crystalline metal foil except for a region thereof fixed by the fixation member from coming in contact with other materials, thereby making it possible to prevent a grain growth pinning phenomenon occurring due to a contact between the poly-crystalline metal foil and other materials at the time of thermal treatment and stress due to thermal deformation. Here, the number of fixation parts of the poly-crystalline metal foil may be one or two or more, but in view of minimizing a contact with other materials, it is preferable that the number of fixation parts is one.

Particularly, in view of obtaining a single crystalline metal foil having a large area, it is preferable that thermal treatment is performed in a state in which the non-fixation part except for the fixation part, that is, a region which will substantially become the single crystalline metal foil, is kept straight. That is, it is preferable that the non-fixation part of the poly-crystalline metal foil is thermally treated in a state in which the non-fixation part thereof is kept straight, and when there is a crease or wrinkle in the non-fixation part of the poly-crystalline metal foil, a grain boundary may be formed along the crease or wrinkle, which is not preferable. Here, the term "straightly unfolded state" means a state in which the poly-crystalline metal foil is completely and flatly suspended without a crease, wrinkle, or bend.

Meanwhile, the poly-crystalline metal foil according to the exemplary embodiment of the present invention may be positioned to be spaced apart from the base in a form in which it hangs on the fixation member in the gravity direction, and an angle between one surface of the poly-crystalline metal foil hanging on the fixation member and a bottom surface may be 80 to 90°, and more preferably 90°. Therefore, entirely uniform stress may be applied to the poly-crystalline metal foil. Here, the angle except for a right angle (90°) is based on an acute angle between the bottom surface and one surface of the poly-crystalline metal foil.

Figure 4A:
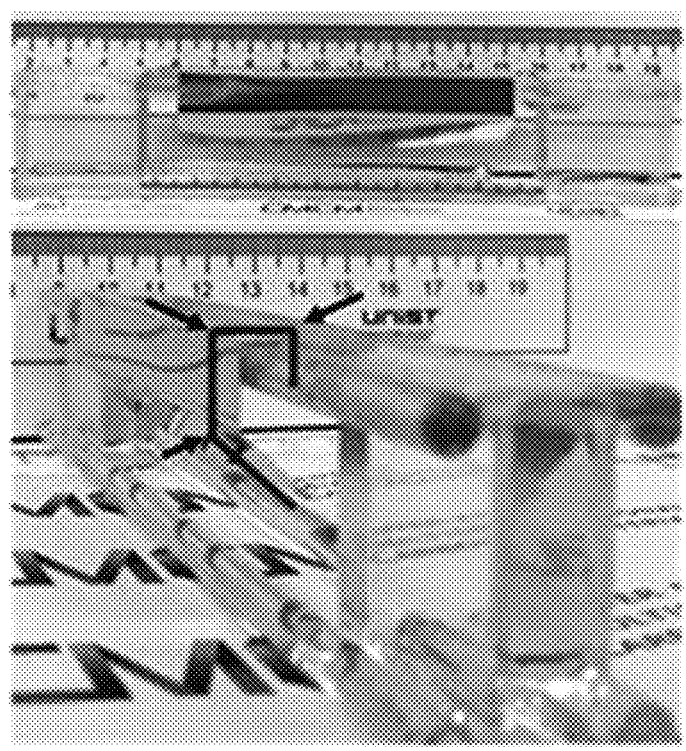
FIG. 4A is a photograph of poly-crystalline metal foil hanging on a quartz holder according to an exemplary embodiment of the present invention.

As a specific example, as showed in a schematic diagram of FIG. 1 or a photograph of FIG. 4A, a distal end region of the poly-crystalline metal foil may be folded in a hook shape and hang on the holder so that the remaining region of the poly-crystalline metal foil that does not come in contact with the holder is perpendicular to the base. Alternatively, one distal end of the poly-crystalline metal foil may be fixed by the fixation member, such that the poly-crystalline metal foil may hang in a direction perpendicular to the base. As described above, the single crystalline metal foil having a large area may be more effectively manufactured by hanging the poly-crystalline metal foil in the direction perpendicular to the base to allow the entirely uniform stress to be applied to the poly-crystalline metal foil while minimizing the contact with other materials.

Here, as the fixation member, a high-temperature material that is not deformed under a high thermal treatment temperature condition and does not react with the poly-crystalline metal foil may be preferably used. As a specific example, a fixation member made of quartz, alumina, zirconia, or the like, may be preferably used.

A shape of the fixation member is not particularly limited as long as the poly-crystalline metal foil may be positioned to be spaced apart from the base. As a specific example, a bar type holder as showed in the schematic diagram of FIG. 1, a holder having one or more clamps, a holder having one or more hook rings, or the like, may be used, but the example of the holder is not limited thereto.

According to the exemplary embodiment of the present invention, it is preferable to suitably adjust a thickness of the poly-crystalline metal foil for more effective conversion to single crystalline metal foil.

As a specific example, the thickness of the poly-crystalline metal foil may be 5 to 200 μm, more preferably 10 to 100 μm. Within the above-mentioned range, the single crystalline metal foil may be effectively manufactured. The single crystalline metal foil having a large area may be manufactured by minimizing the stress applied to the poly-crystalline metal foil within the above-mentioned range, and it may be easy to handle a test sample. When the thickness is excessively thin, a single crystalline metal foil having a (111) crystal surface in the plane normal direction may be easily formed by surface energy, but formation of the grain boundary may be increased due to an increase in stress generation due to deformation at the time of thermal treatment, which is not preferable. On the contrary, when the thickness of the metal foil is excessively thick, grain growth may be limited, such that it may be difficult to manufacture the single crystalline metal foil having a large area.

A material of the poly-crystalline metal foil is not particularly limited as long as it is a transition metal. As a more specific example, the poly-crystalline metal foil may be copper (Cu), nickel (Ni), cobalt (Co), iron (Fe), ruthenium (Ru), rhodium (Rh), palladium (Pd), platinum (Pt), silver (Ag), rhenium (Re), iridium (Ir), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn) foil, etc.

As an example, in the case of transition metal foil having a closely packed structure such as a face centered cubic (FCC) or hexagonal close packing (HCP) structure, since a (111) crystal plane in the FCC structure and a (0001) crystal plane in the HCP structure have the lowest surface energy, when thermal treatment is performed near a melting point of a metal under the conditions at which there is no additional external force by a contact with other materials, which can cause gran growth pinning and thermal stress generation by different coefficients of thermal expansion, a FCC metal and a HCP metal are spontaneously converted to have the (111) crystal plane and the (0001) crystal plane, respectively, such that the single crystalline metal foil having a large area may be formed.

According to the exemplary embodiment of the present invention, thermal treatment may be performed under general thermal treatment conditions of metal foil. As a specific example, the thermal treatment may be performed at a temperature satisfying the following Equation 2 and a pressure of 0.0001 to 10 atm for 0.5 to 100 hours.

$$0.3 \times T_m \leq T < T_m \quad \text{[Equation 2]}$$

(In Equation 2, T is a thermal treatment temperature (° C.), and $T_m$ is a melting point temperature (° C.) of a metal of the poly-crystalline metal foil.)

The single crystalline metal foil may be effectively manufactured by changing the thermal treatment condition depending on the kind of metal foil as described above. As a more specific example, in the case of tungsten having a highest melting point temperature of 3422° C., thermal treatment may be performed at a temperature of about 3400° C. More preferably, the thermal treatment is performed at a temperature satisfying $0.6 \times T_m \leq T < T_m$ and a pressure of 0.01 to 3 atm for 10 to 60 hours, which is preferable in that the single crystalline metal foil having a large area may be effectively manufactured.

Further, it is preferable that the thermal treatment is performed under a hydrogen gas atmosphere, argon gas atmosphere, or a hydrogen-argon mixed gas atmosphere. The hydrogen gas, the argon gas, or the hydrogen-argon mixed gas may be injected at a rate of 1 to 500 sccm. In the case of injecting the hydrogen-argon mixed gas, a mixing ratio (sccm ratio) of hydrogen gas and argon gas may be 1:0.1 to 10, but is not necessarily limited thereto. Oxidation of the metal foil may be prevented by performing the thermal treatment under the hydrogen gas atmosphere or the hydrogen-argon mixed gas atmosphere, and migration of metal atoms may be accelerated, thereby making it possible to promote crystal growth.

Further, the present invention provides single crystalline metal foil manufactured by the manufacturing method for single crystalline metal foil described above.

Both surfaces of the single crystalline metal foil manufactured by the above-mentioned method may have the same crystal plane. More specifically, the single crystalline metal foil may satisfy the following Equation 1.

$$95 \leq (A_{normal}/A_{total}) \times 100 \quad \text{[Equation 1]}$$

(In Equation 1, $A_{total}$ is a total area of a test sample, and $A_{normal}$ is an area of grains having the same crystal plane in a plane normal direction in the test sample. $A_{normal}/A_{total}$ is measured based on a test sample having a size of 2 cm×8 cm, and the same crystal plane is a (111), (001), (112), (123), or (0001) crystal plane.)

As described above, according to the present invention, the contact between the poly-crystalline metal foil and other materials may be minimized by positioning the poly-crystalline metal foil to be spaced apart from the base, for example, the inner surface of the chamber, such that the grain growth pinning phenomenon may be prevented, and stress generation due to thermal deformation may be suppressed, thereby making it possible to effectively manufacture single crystalline metal foil having a large area.

Further, as both surfaces of the poly-crystalline metal foil may be thermally treated under the same conditions as each other by positioning the poly-crystalline metal foil to be spaced apart from the base, formation of a single crystal may be more effectively performed. Therefore, both surfaces of the manufactured single crystalline metal foil may have the same crystal plane as each other. Particularly, as the single crystalline metal foil may have the same crystal plane in both in-plane and out-of-plane (plane normal) directions, single crystalline metal foil having high quality may be manufactured. More specifically, the single crystalline metal foil may have a (111), (001), (112), (123), or (0001) crystal plane based on the plane normal.

As a thermal treatment method in the present invention, various methods such as a heating method using a general furnace, a resistive heating method, a ramp heating method, and an induction heating method may be used. However, the thermal treatment method is not particularly limited as long as it is possible to increase a temperature to a desired temperature.

As described above, the single crystalline metal foil having high quality and a large area according to the present invention may be used without limitation in any field in which existing poly-crystalline or single crystalline metal foil has been used. As a specific example, based on excellent electrical conductivity and thermal conductivity of a single crystalline metal as compared to a poly-crystalline metal, the single crystalline metal foil may be used as a high performance metal component material throughout fields of electric and electronic products such as a printed circuit board and a heat sink. Particularly, a high-efficiency component suitable for the trend toward miniaturization and high integration of electric and electronic products may be provided. Further, the single crystalline metal foil manufactured according to the present invention may have uniform surface crystallinity, such that the single crystalline metal foil may be widely utilized as a catalyst for synthesis of graphene and 2-dimensional nano-materials and various chemical reactions.

Further, the present invention provides a manufacturing apparatus for single crystalline metal foil capable of manufacturing the single crystalline metal foil described above.

In detail, a manufacturing apparatus for single crystalline metal foil according to an exemplary embodiment of the present invention may include: a chamber 100; a heater 200 provided in one side of the chamber to apply heat; a gas inlet 300 through which a gas is injected to the chamber; a gas outlet 400 through which the gas is discharged from the chamber; a pressure controller 500 connected to the chamber; and a metal foil holder provided in the chamber.

Figure 9:
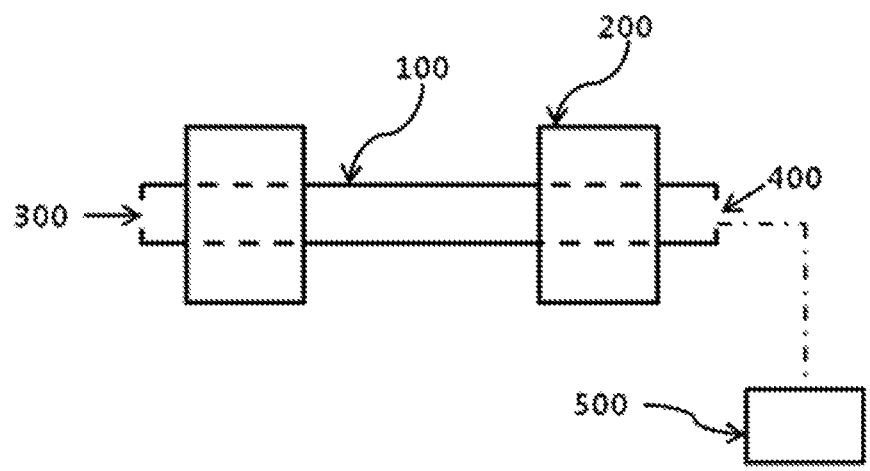
FIG. 9 is a diagram schematically showing the manufacturing apparatus for single crystalline metal foil according to the exemplary embodiment of the present invention.

More specifically, as showed in FIGS. 9 and 10 by way of example of the present invention, the gas inlet 300 and the gas outlet 400 are provided at both distal ends of the chamber 100, respectively, the heater 200 capable of substantially performing thermal treatment is positioned outside the chamber 100, the pressure controller 500 capable of adjusting a pressure in the chamber 100 is connected to one end of the chamber 100, and the metal foil holder is provided in the chamber.

More specifically, a shape of the metal foil holder is not particularly limited as long as it may minimize deformation of the poly-crystalline metal foil caused by a contact with the chamber 100, the metal foil holder, and the like during the thermal treatment and maintain a state in which the poly-crystalline metal foil is kept straight. However, as a preferable example, the metal foil holder may include a metal foil fixation member provided with a rod, a clamp, or a hook ring as showed in FIG. 1. In more detail, when the metal foil fixation member is a rod, the metal foil holder may include two pillars positioned to be spaced apart from each other, and the rod physically connecting these two rods to each other. Alternatively, when the metal foil fixation member is a clamp or hook ring, the metal foil holder may be a clamp or hook ring physically connected to an upper surface of an internal region of the chamber 100. However, the present invention is not necessarily limited thereto, but the poly-crystalline metal foil may be held in another form as long as a non-fixation part of the poly-crystalline metal foil except for a fixation part of the poly-crystalline metal foil fixed by the metal foil fixation member does not come in contact with other materials such as the chamber and the metal foil holder.

Here, as the metal foil holder, a high-temperature material that is not deformed under a high thermal treatment temperature condition and does not react with the poly-crystalline metal foil may be preferably used. As a specific example, a metal foil holder made of quartz, alumina, zirconia, or the like, may be preferably used. Further, when the metal foil fixation member is the rod, the rod is not particularly limited as long as it may physically connect two pillars to each other, but it is preferable that the rod is parallel with the base in a length direction of the rod.

According to the exemplary embodiment of the present invention, the heater 200 is to increase the temperature in the chamber for conversion of the poly-crystalline metal foil to a single crystalline metal foil, and any heater may be used without particular limitation as long as it may increase the temperature in the chamber 100 and a temperature of the poly-crystalline metal foil to the desired temperature. As a specific example, the heater 200 may apply heat using a furnace, a resistive heating method, a ramp heating method, or an induction heating method.

According to the exemplary embodiment of the present invention, the gas inlet 300 is to inject gas capable of adjusting a thermal treatment atmosphere in the chamber 100 at the time of thermal treatment. More specifically, the gas inlet 300 is to inject hydrogen, argon, or hydrogen-argon mixed gas into the chamber. The gas outlet 400 is to discharge these hydrogen, argon, or hydrogen-argon mixed gas, or air filled in the chamber before injecting these gases into the chamber 100.

According to the exemplary embodiment of the present invention, the pressure controller 500, which is to suitably adjust the pressure in the chamber 100, may adjust an amount and a rate of the gas introduced through the gas inlet 300 or discharged through the gas outlet 400 to adjust the pressure in the chamber 100. That is, when the pressure in the chamber 100 is low, the pressure in the chamber 100 may be increased by introducing the gas into the chamber 100 through the gas inlet 300, and when the pressure in the chamber 100 is high, the pressure in the chamber 100 may be decreased by discharging the gas from the chamber 100 through the gas outlet 400.

Hereinafter, single crystalline metal foil and the manufacturing method therefor according to the present invention will be described in detail through Examples. However, the following Examples are only to specifically explain the present invention, but the present invention is not limited thereto and may be implemented in various forms.

In addition, unless defined otherwise in the specification, all the technical and scientific terms used in the specification have the same meanings as those that are generally understood by those who skilled in the art. The terms used in the specification are only to effectively describe a specific Example, but are not to limit the present invention. Further, unless particularly described in the present specification, a unit of additives may be wt %.

Example 1

Single crystalline copper foil having the same (111) crystal plane throughout an entire region of a test sample was manufactured by hanging commercialized poly-crystalline copper foil on a quartz holder as showed in FIG. 1 and performing thermal treatment on the poly-crystalline copper foil. Here, a poly-crystalline copper foil test sample had a size of 2 cm×8 cm and a thickness of 5 μm.

At the time of thermal treatment, hydrogen and argon were injected at a rate of 10 sccm, respectively, and after a temperature was raised up to 1050° C. for 2 hours at a pressure condition of 760 torr, the temperature was maintained at 1050° C. for 12 hours, and then rapidly cooled.

Examples 2 to 10

Single crystalline metal foil was manufactured by changing variations as showed in the following Table 1, and the other conditions were the same as those in Example 1. Here, in Examples 8 and 9, since a thermal treatment temperature was higher, the temperature was raised up to 1350° C. for 3 hours.

Comparative Example 1

Thermal treatment was performed under the same conditions as those in Example 6 except that thermal treatment was performed in a state in which the poly-crystalline copper foil did not hang on the holder but was placed on a bottom surface of a general quartz chamber.

TABLE 1

| | Metal Foil | | $(A_{out}/$ | Thermal Treatment | | |
|---|---|---|---|---|---|---|
| | Kind | Thickness (μm) | $A_{total}) \times 100$ | Temperature (° C.) | Time | $H_2$/Ar (sccm) |
| Example 1 | Cu | 5 | 5> | 1050 | 12 | 10/10 |
| Example 2 | Cu | 10 | 99< | 1050 | 12 | 10/10 |
| Example 3 | Cu | 20 | 99< | | | |
| Example 4 | Cu | 30 | 99< | | | |
| Example 5 | Cu | 50 | 99< | | | |
| Example 6 | Cu | 80 | 99< | | | |
| Example 7 | Cu | 200 | ~10 | 1050 | 96 | 10/10 |
| Example 8 | Ni | 100 | 99< | 1350 | 24 | 30/30 |
| Example 9 | Co | 50 | 99< | | 48 | |
| Comparative Example 1 | Cu | 80 | ~48 | 1050 | 12 | 10/10 |

Figure 4B:
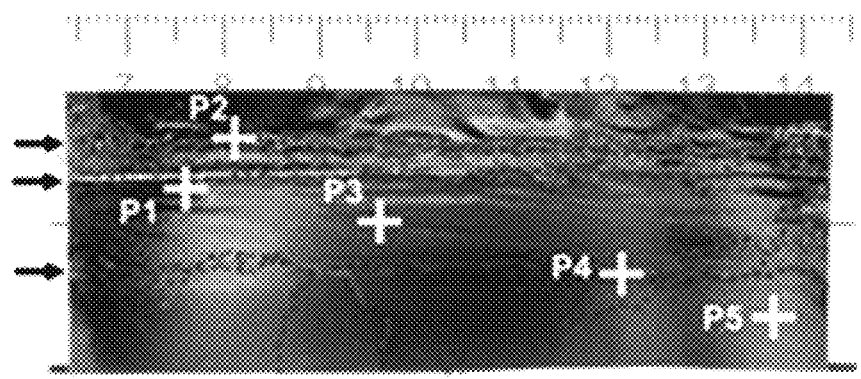
FIG. 4B is a photograph of single crystalline copper foil manufactured by thermally treating the poly-crystalline metal foil.
Figure 4C:
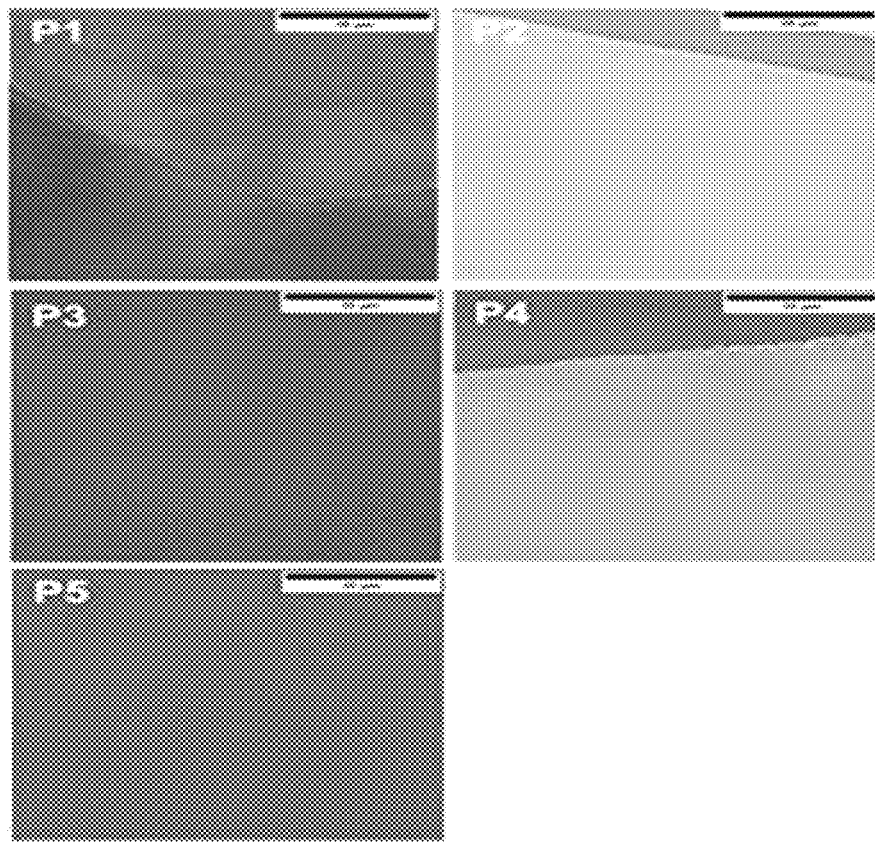
FIG. 4C shows analysis results of EBSD IPF map of positions P1 to P5 of FIG. 4B. However, in order to confirm an influence of crystal growth on mechanical deformation, after artificially folding a middle region of a sample at an angle of 45°, thermal treatment was performed unlike cases in FIGS. 1 and 2A to 2D.

First, in Example 6 and Comparative Example 1, only the positions of the poly-crystalline copper foil at the time of thermal treatment were different from each other, and it may be confirmed that in Example 6 in which thermal treatment was performed in a state in which the poly-crystalline copper foil was positioned to be spaced apart from the base by hanging the poly-crystalline copper foil on the holder, single crystal copper foil having an identical orientation both plane normal and in-plane direction throughout the entire region of the test sample (2 cm×8 cm) was manufactured as showed in FIGS. 2A to 2D. Further, as showed in FIG. 4B, a single crystalline region (a region between second and third arrows from the top) oriented in the same crystal plane had a large area (about cm×7 cm). Here, a region between first and second arrows from the top of FIG. 4B was a region of poly-crystalline copper coil coming in contact with the holder as showed in FIG. 4A, and it may be confirmed that as the poly-crystalline copper coil came in contact with the quartz holder corresponding to a different material, conversion to the single crystalline copper foil from the poly-crystalline copper foil did not occur. Further, a region indicated by the third arrow was a region of the poly-crystalline copper coil at which the poly-crystalline copper coil was folded at an angle of 45° as showed in FIG. 4A and thus stress was generated, and it may be confirmed that the folded region and a grain boundary of the copper foil almost coincided with each other. The reason is that crystal growth was suppressed by the stress existing in the folded region.

Meanwhile, in Comparative Example 1 in which thermal treatment was performed in a state in which the poly-crystalline copper foil was put into a quartz tube chamber according to an existing method and both surfaces of the poly-crystalline copper foil came in contact with a quartz tube as showed in FIGS. 3A to 3D. Even though all the thermal treatment conditions were the same except for the specific configuration of the foils, a larger number of grain boundaries were formed as showed in FIGS. 3A to 3D, and a single crystalline region was significantly narrow. The reason may be due to a grain growth pinning phenomenon due to a contact between the quartz tube and the poly-crystalline copper foil, and stress due to thermal deformation occurred. In this case, $(A_{normal}/A_{total})$ was about 48%.

Next, in Examples 1 to 7, conversion of single crystalline metal foils were investigated while changing the thickness of the foil. In Examples 2 to 6, single crystalline copper foil having a large area was effectively manufactured throughout an entire region of the test sample that does not come in contact with the quartz holder shown in FIGS. 2A to 2D and 4A to 4C. On the contrary, in Example 1, since deformation easily occurred due to an excessively thin thickness of the copper foil, a large number of grain boundaries were formed. Further, in Example 7, even though a thermal treatment time was increased to a maximum of 96 hours, a large number of grain boundaries were present, and ($A_{normal}/A_{total}$) was also limited to about 10%. The reason is that as the thickness of the foil was increased, crystal growth was restricted.

Figure 5A:
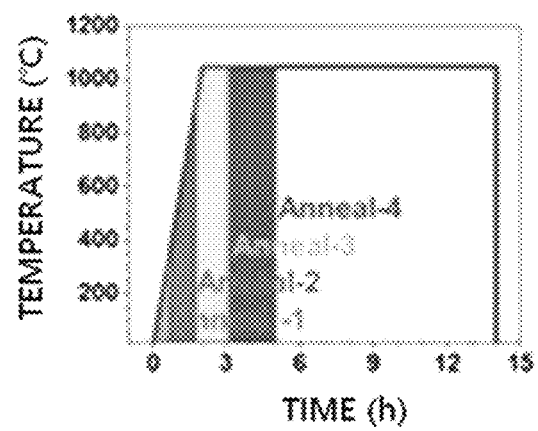
FIG. 5A is a temperature-time graph showing thermal treatment conditions according to an exemplary embodiment of the present invention.
Figure 5B:
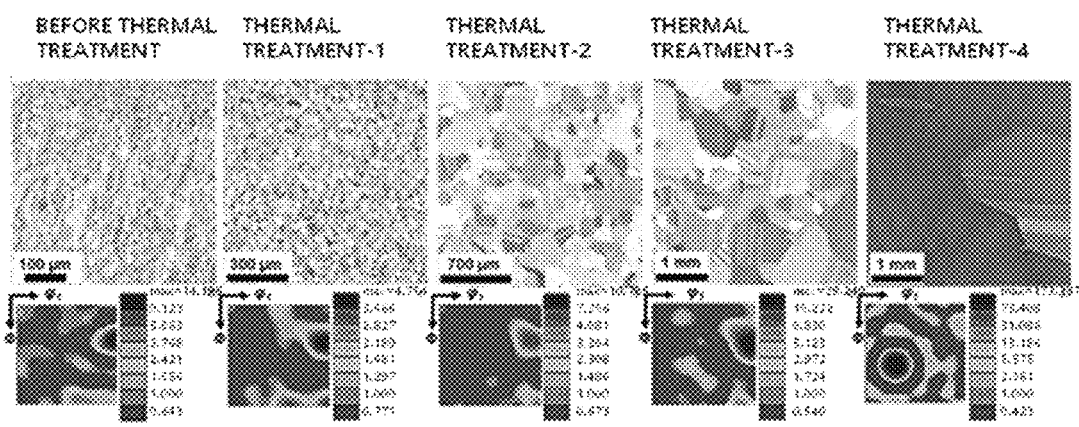
Figure 5C:
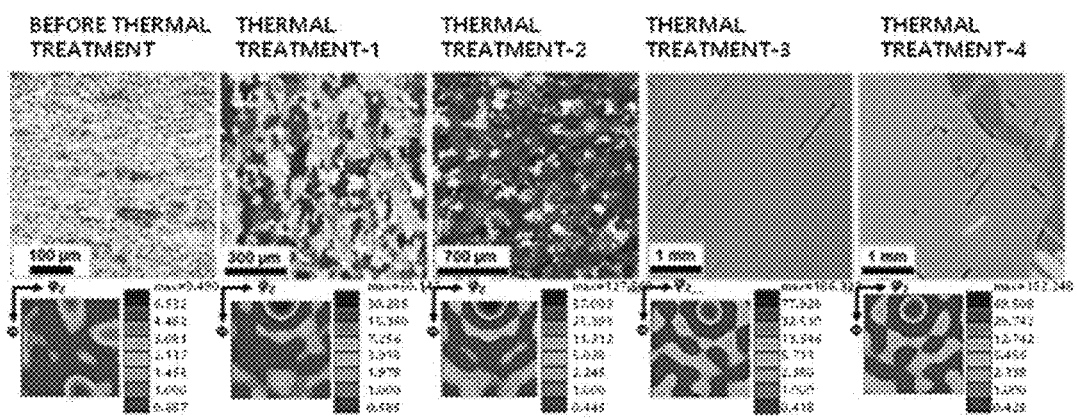
Figure 6A:
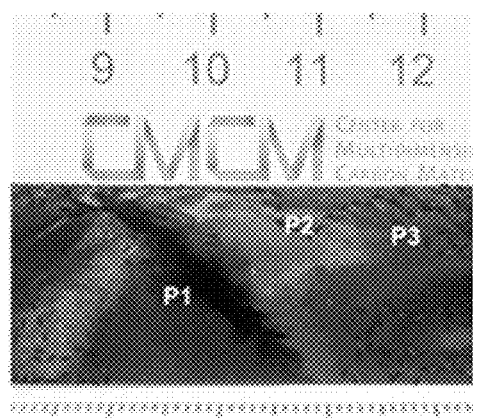
FIG. 6A is a photograph of single crystalline copper foil having a crystal plane close to (001) crystal plane in the plane normal direction, manufactured according to an exemplary embodiment of the present invention.
Figure 6B:
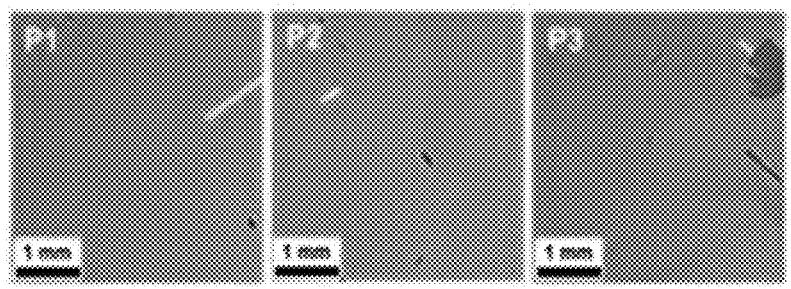
FIG. 6B shows analysis results of EBSD IPF map of positions P1 to P3 of FIG. 6A.

Meanwhile, FIGS. 5A to 5C shows analysis results of changes in EBSD IPF map and orientation distribution function (ODF) of the poly-crystalline copper foil depending on heat treatment temperatures and times that showed the changes of texture depending on heat treatment temperatures and times. In addition, by comparing FIGS. 5B and 5C, a crystal plane of a final single crystalline copper foil was affected by the initial texture of the commercialized poly-crystalline copper foil itself. FIG. 5B shows copper foil oriented to a (111) crystal plane in the plane normal direction, and FIG. 5C shows copper foil oriented to a (001) crystal plane in the plane normal direction. The copper foil oriented to the (111) crystal plane in the plane normal direction mainly has (112) and (110) textures before thermal treatment, and the copper foil oriented to the (001) crystal plane in the plane normal direction mainly has (112), (110) and (001) textures before thermal treatment. FIGS. 6A and 6B shows single crystalline copper foil oriented to a (001) crystal plane, manufactured by thermally treating poly-crystalline copper foil having (112), (110) and (001) textures, wherein FIG. 6A is a photograph of single crystalline copper foil having a crystal plane close to the (001) crystal plane in the plane normal, and FIG. 6B shows analysis results of EBSD IPF map of positions p1 to P3 of FIG. 6A.

Figure 7A:
FIG. 7A is a photograph of single crystalline nickel foil having a (111) crystal plane in the plane normal direction, manufactured according to an exemplary embodiment of the present invention.
Figure 7B:
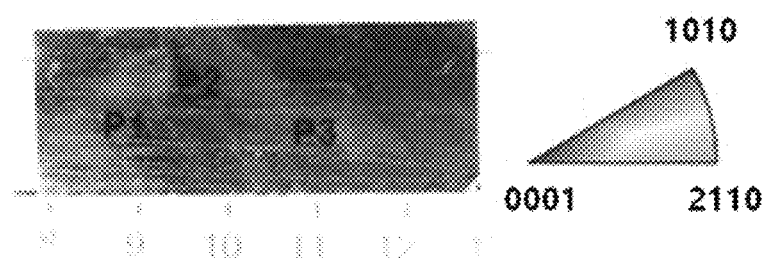
FIG. 7B is a photograph of single crystalline cobalt foil having a (0001) crystal plane in the plane normal direction, manufactured according to an exemplary embodiment of the present invention.
Figure 7C:
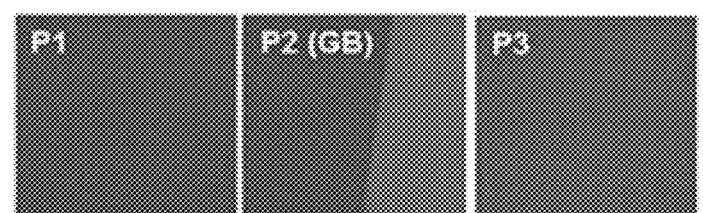
FIG. 7C shows analysis results of EBSD IPF map of positions P1 to P3 of FIG. 7A in the plane normal direction.
Figure 7D:
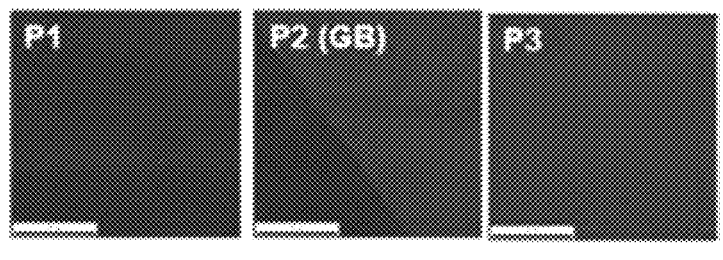
FIG. 7D shows analysis results of EBSD IPF map of positions P1 to P3 of FIG. 7B in the plane normal direction.

In Example 8, conversion of poly-crystalline nickel foil to single crystalline nickel foil was performed, and in Example 9, conversion of poly-crystalline cobalt foil to single crystalline cobalt foil was performed. The results showed that single crystalline nickel foil having a (111) crystal plane in the plane normal direction was manufactured as showed in FIGS. 7A and 7C, and single crystalline cobalt foil having a (0001) crystal plane in the plane normal direction was manufactured as showed in FIGS. 7B and 7D.

Manufacturing Example 1

Graphene was grown by a general method using the single crystalline copper foil manufactured in Example 6 as a metal catalyst layer.

The graphene was grown by injecting methane gas (5 sccm) for 30 minutes after heating the copper foil first under a hydrogen atmosphere (20 sccm) at 1050° C. for 30 minutes.

Figure 8A:
FIG. 8A is a polarization optical microscope (POM) photograph of graphene coated with a liquid crystal grown on a poly-crystalline metal foil.
Figure 8B:
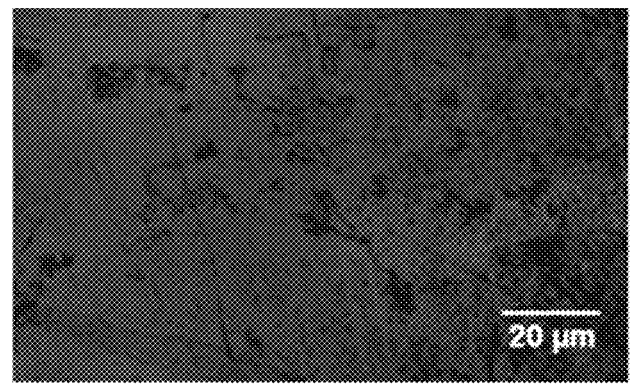
FIG. 8B is a POM photograph of graphene coated with a liquid crystal grown on a single crystalline metal foil manufactured according to an exemplary embodiment of the present invention.

FIGS. 8A and 8B shows polarized optical microscope (POM) images of liquid crystal (LC)-decorated graphenes, which were grown on polycrystalline and single crystal copper foils by using the method described in Manufacturing Example 1. Since the liquid crystal molecules are aligned in the crystal direction of the graphene and exhibit the polarization property, when the crystal directions of the graphene in some regions are equal to each other, the same color was exhibited. In the case in which the graphene was grown on the single crystalline metal foil (FIG. 8B), a uniform color was exhibited as compared to the case in which the graphene was grown on the poly-crystalline metal foil (FIG. 8A). It means that the graphene manufactured on single crystalline metal foil was close to single crystalline graphene.

Hereinabove, although the present invention is described by specific matters and exemplary embodiments, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

The invention claimed is:

1. A manufacturing method for single crystalline metal foil, the method comprising:
   thermally treating a poly-crystalline metal foil in a chamber to manufacture the single crystalline metal foil,
   wherein the poly-crystalline metal foil has a thickness ranging from 5 μm to 200 μm,
   wherein the chamber comprises a holder, and the poly-crystalline metal foil is suspended in the chamber from the holder via a fixation part of the poly-crystalline metal foil such that the poly-crystalline metal foil is spaced apart from a bottom surface and an inner surface of the chamber, and
   wherein a non-fixation part of the poly-crystalline metal foil is freely suspended to minimize a stress applied to the poly-crystalline metal foil.

2. The manufacturing method of claim 1, wherein the non-fixation part is thermally treated in a state in which the non-fixation part is kept straight.

3. The manufacturing method of claim 1, wherein the poly-crystalline metal foil is copper (Cu), nickel (Ni), cobalt (Co), iron (Fe), ruthenium (Ru), rhodium (Rh), palladium (Pd), platinum (Pt), silver (Ag), rhenium (Re), iridium (Ir), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn) foil.

4. The manufacturing method of claim 1, wherein the single crystalline metal foil has a first surface and a second surface, and a crystal plane on the first surface and a crystal plane on the second surface are the same.

5. The manufacturing method of claim 1, wherein the single crystalline metal foil has a (111), (001), (112), (123), or (0001) crystal plane based on a direction perpendicular to the plane.

6. The manufacturing method of claim 1, wherein the thermal treatment is performed at a temperature satisfying the following Equation and a pressure of 0.0001 to 10 atm for 0.5 to 90 hours, $$0.3 \times T_m < T < T_m$$

wherein T is a thermal treatment temperature (° C.), and $T_m$ is a melting point temperature (° C.) of a metal in the poly-crystalline metal foil.

7. The manufacturing method of claim 1, wherein the thermal treatment is performed under a hydrogen gas atmosphere, an argon gas atmosphere, or a hydrogen-argon mixed gas atmosphere, the hydrogen gas, the argon gas, or the hydrogen-argon mixed gas being injected at a rate of 1 to 500 sccm.

* * * * *